(12) United States Patent
Datskos et al.

(10) Patent No.: US 7,244,959 B1
(45) Date of Patent: Jul. 17, 2007

(54) DETECTION OF ELECTROMAGNETIC RADIATION USING MICROMECHANICAL MULTIPLE QUANTUM WELLS STRUCTURES

(75) Inventors: Panagiotis G. Datskos, Knoxville, TN (US); Slobodan Rajic, Knoxville, TN (US); Irene Datskou, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 11/358,933

(22) Filed: Feb. 21, 2006

(51) Int. Cl.
*H01L 31/00* (2006.01)

(52) U.S. Cl. ............... 257/21; 257/22; 257/11; 257/12

(58) Field of Classification Search ............... None
See application file for complete search history.

(56) References Cited

U.S. PATENT DOCUMENTS

| | | | |
|---|---|---|---|
| 6,941,823 B1 * | 9/2005 | Lai et al. | 73/862.639 |
| 2005/0161749 A1 * | 7/2005 | Yang et al. | 257/414 |

OTHER PUBLICATIONS

P.I. Oden et al., "Optical and Infrared Detection Using Microcantilevers", SPIE, 1996, vol. 2744. (IDS Reference 7).*
P.G. Datskos, et al., "Remote Infrared Radiation Detection Using Piezoresistive Microcantilevers," Appl Phys Lett, 1996, pp. 2986-2988, vol. 69, No. 20.
P.G. Datskos, et al., "Photoinduced and Thermal Stress in Silicon Microcatilevers," Appl Phys Lett, 1998, pp. 2319-2321, vol. 73, No. 16.
P.I. Oden, et al., "Optical and Infrared Detection Using Microcantilevers," SPIE, 1996, vol. 2744.

* cited by examiner

*Primary Examiner*—Leonardo Andujar
(74) *Attorney, Agent, or Firm*—Kirk A. Wilson

(57) ABSTRACT

An apparatus and method for detecting electromagnetic radiation employs a deflectable micromechanical apparatus incorporating multiple quantum wells structures. When photons strike the quantum-well structure, physical stresses are created within the sensor, similar to a "bimetallic effect." The stresses cause the sensor to bend. The extent of deflection of the sensor can be measured through any of a variety of conventional means to provide a measurement of the photons striking the sensor. A large number of such sensors can be arranged in a two-dimensional array to provide imaging capability.

3 Claims, 4 Drawing Sheets

DETECTION OF ELECTROMAGNETIC RADIATION USING MICROMECHANICAL MULTIPLE QUANTUM WELLS STRUCTURES

STATEMENT REGARDING FEDERALLY SPONSORED RESEARCH

This invention was made with United States Government support under Contract No. DE-AC05-00OR22725 between the United States Department of Energy and U.T. Battelle, LLC. The United States Government has certain rights in this invention.

TECHNICAL FIELD

The present invention relates generally to a method and apparatus for detecting electromagnetic radiation and relates more specifically to a microcantilever comprised of multiple quantum well structures which cause a material stress in the microcantilever when exposed to electromagnetic radiation.

BACKGROUND OF THE INVENTION

Quantum well heterostructures are key components of many optoelectronic devices. Generally speaking, a quantum well heterostructure consists of thin layers of a narrower-gap semiconductor material disposed between thicker layers of a wider-gap material. Quantum interference effects begin to appear prominently in the motion of the electrons at the interfaces, and the band profile shows a series of "wells."

Quantum-well infrared photodetectors have been used successfully in infrared detectors. Infrared photons excite ground state electrons out of a stack of quantum wells in a quantum-well infrared photodetector, producing a photocurrent in an applied electric field. When a photon strikes the well it excites an electron in the ground state to a first excited state, then an externally applied voltage sweeps the photoexcited electron out, producing a photocurrent. This photocurrent in the applied electric field can be sensed, thereby detecting the presence of infrared photons. By placing a large number of such quantum-well infrared photodetectors in a two-dimensional array and optically coupling the array to the field of view, infrared imaging is possible.

Quantum-well photodetectors which sense a photocurrent in an applied electric field suffer significant drawbacks in the form of dark current effects, i.e., the current that flows through a biased semiconductor when no photons are impinging upon it. Because dark current effects are temperature sensitive, the photodetector must be cooled in order to function accurately, or other elaborate measures must be taken to counteract dark current effects.

Thus there is a need for a quantum-well photodetector which avoids the drawbacks of dark current effects. There is a further need for a quantum-well photodetector which does not require cooling or other elaborate precautions to compensate for dark current effects.

SUMMARY OF THE INVENTION

The present invention overcomes the problems associated with quantum-well photodetectors which operate by detecting photocurrent in an applied electric field. The quantum-well photodetector of the present invention detects the presence of photons by an entirely different mechanism. Consequently the problems associated with dark current are eliminated. The quantum-well photodetector of the present invention is therefore accurate over a wide range of temperatures, and cooling or other elaborate measures are not needed.

Stated more specifically, the present invention relates generally to a device which can be used to detect electromagnetic radiation operating at ambient temperatures. The quantum-wells sensor of the present invention comprises a deflectable member consisting of thin layers of a narrower-gap semiconductor material disposed between thicker barrier layers of a wider-gap material. The layers can be arranged longitudinally or transversely within the deflectable member. When photons strike the quantum-well structure, physical stresses are created within the deflectable member, similar to a "bimetallic effect." The stresses cause the deflectable member to bend. The extent of deflection of the deflectable member can be measured through any of a variety of conventional means to provide a measurement of the photons striking the sensor. A large number of such sensors can be arranged in a two-dimensional array to provide imaging capability.

The device can be tuned to specific photon wavelengths or bands and has fast response times. The effect of the thermally generated carriers is eliminated or at least minimized due to the fact that the charge carriers raised into higher states are not sensed as an increase in the photoconductivity but rather as a change in material stress. The sensing device can therefore operate independently of temperature and thus eliminates the need for cooling.

Thus it is an object of the present invention to provide an improved electromagnetic radiation detector.

It is another object of the present invention to provide an electromagnetic radiation detector based on quantum well structures which avoids the problems associated with "dark current."

It is still another object of the present invention to provide an electromagnetic radiation detector which can operate over a wide range of temperatures without the need for complex and costly cooling apparatus.

Other objects, features, and advantages of the present invention will become apparent upon reading the following specification, when taken in conjunction with the drawings and the appended claims.

DETAILED DESCRIPTION OF INVENTION

Figure 1:
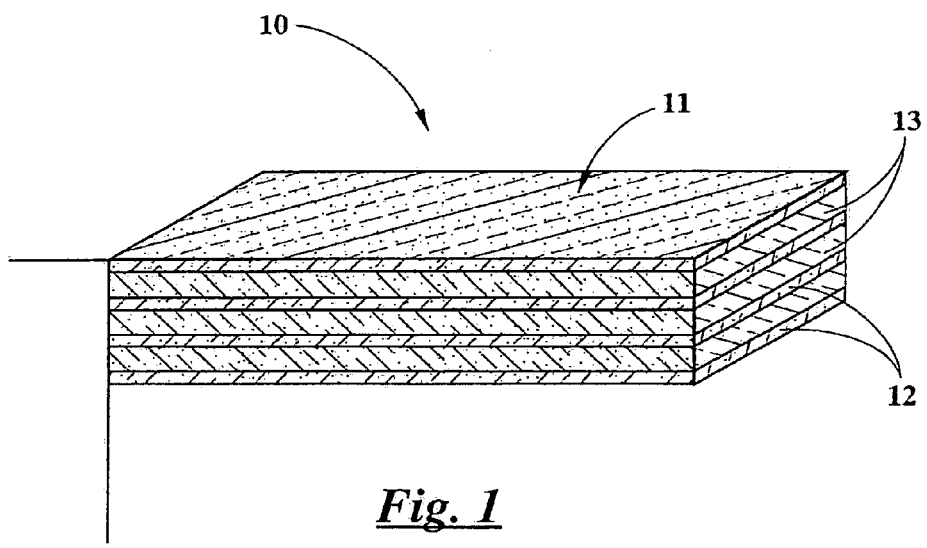
FIG. 1 is a schematic representation of a photon sensor according to a first embodiment of the present invention, with the sensor in its normal or "rest" state.

Referring now to the drawings, in which like numerals indicate like elements throughout the several views, FIG. 1 shows a photon detector or sensor 10. The sensor 10 comprises a deflectable member, more specifically a microbar or microcantilever 11, which exhibits a quantum well effect. The quantum wells result from very thin layers of a semiconductor material grown either on or between thicker barrier layers of semiconductor material so that electron wavefunctions do not overlap between adjacent layers. More specifically, thin layers 12 of a narrow bandgap material such as gallium arsenide (GaAs) are sandwiched between thicker barrier layers 13 of a wider bandgap material such as aluminum gallium arsenide (AlGaAs).

Figure 2:
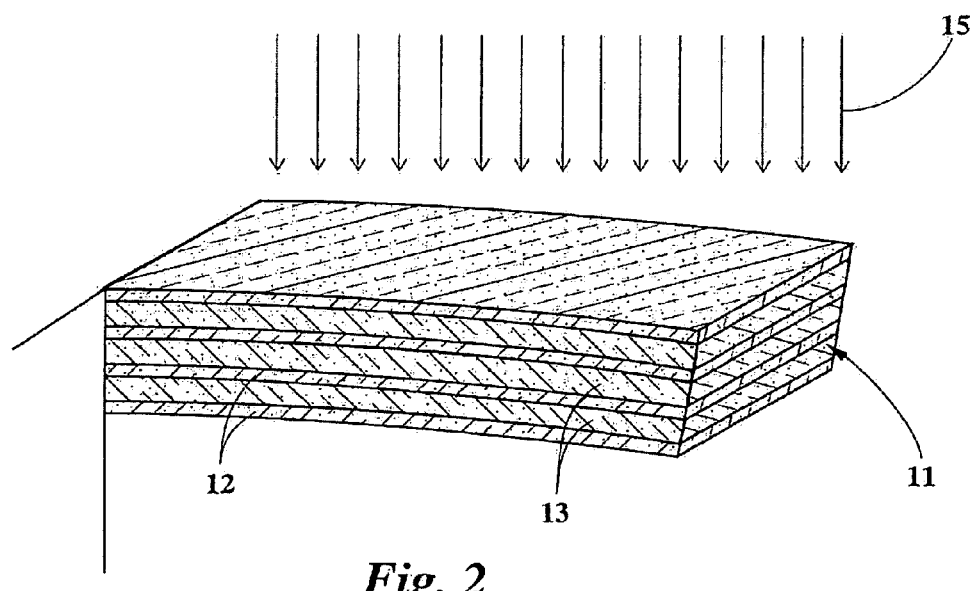
FIG. 2 is a schematic representation of the photon sensor of FIG. 1 showing the sensor in a deflected state caused by exposure to photons.

In a semiconductor, excess free charge carriers produce a local mechanical strain. This effect will either increase or decrease the lattice parameter in an irradiated semiconductor crystal. Thus when electromagnetic radiation 15 strikes the sensor 10, as shown in FIG. 2, excess free charge carriers create a mechanical strain which causes the microcantilever 11 to deform.

The mechanical strain created by the excess free charge carriers is more significant than other strains induced, for example, by temperature changes. When the photon flux is high enough, detection can even be accomplished with more conventional photo acoustic techniques.

As will be appreciated by those skilled in the art, the thickness of the narrow layer 12 and the relative energy gap of the barrier material 13 control the discrete energy levels of the various layers. The bound energy levels can be calculated from $$E = \left(\frac{h^2 n^2}{8 m_e^*}\right)\frac{1}{l_w}$$

where h is Planck's constant, n is the level number, $m_e^*$ is the effective electron mass, and $l_w$ is the well width.

By careful selection of the semiconductor materials and the thickness of the various layers, the device can be tuned to any desired wavelength or wavelength spectrum. The bound energy level E can be expressed as follows:

$$E = \frac{hc}{\lambda}$$

where $\lambda$ is the wavelength of light, h is Planck's constant, and c is the speed of light in vacuum.

Thus if a detector sensitive to a certain wavelength is desired, the bound energy level can be calculated as shown above, and the semiconductor materials and the thicknesses of the various layers can be selected to provide the calculated bound energy level. For example, for a sensor capable of detecting infrared radiation ($\lambda \approx 12$ µm), the necessary bound energy level is 0.1 eV. This bound energy level can be obtained by providing a well width of 4 nm in a detector using the semiconductor materials AlGaAs and GaAs, where the GaAs layer is 4 nm thick.

As will be appreciated by those skilled in the art, there are many possible combinations and permutations of semiconductor materials and layer thicknesses which will yield a desired bound energy level. The example in the foregoing paragraph shows only one such permutation and is not intended to be limiting to the scope of the present invention.

In a semiconductor, excess free charge carriers produce a local mechanical strain. This effect will either increase or decrease the lattice parameter in an irradiated semiconductor crystal. This additional strain is more significant than other strains induced, for example, by temperature changes. When the photon flux is high enough, detection can even be accomplished with more conventional photo acoustic techniques.

The total change in strain due to changes in charge carrier concentration $\Delta n$ and temperature changes $\Delta T$ is the sum of the change in the photo-induced strain $\delta s_{pi}$ and thermal strain $\delta s_{th}$, viz.

$$\delta s = \delta s_{pi} + \delta s_{th} = \left(\frac{1}{3}\frac{d\varepsilon_g}{dP}\Delta n + \alpha \Delta T\right)$$

where $\epsilon_g$ is the energy band gap, P is the induced pressure, and $\alpha$ is the coefficient of thermal expansion.

A hole in the valence band decreases the energy of covalent bonds, while an electron adds to the bonding or antibonding energy. Therefore, depending on the sign of $d\epsilon_g/dP$, which can be either positive or negative, there can be a competing effect between the photo-induced strain and the thermal strain.

The change in $\Delta n$ in a semiconductor film with dimensions of length l, width w, and thickness t, caused by photon flux, can be expressed as:

$$\Delta n = \eta \frac{\Delta \phi T_L}{lwt}$$

where $\eta$ is the quantum efficiency, $\Delta \phi$ is the number of photons per unit time, and $T_L$ is the excess carrier lifetime in the semiconductor. $T_L$ is usually $\sim 10^{-4}$s. This relationship assumes that the changes in charge carrier concentration $\Delta n$ are solely due to signal photons having a lifetime $T_L$ in the detector volume lwt.

If it is assumed that there is a circular plate with a thin film of thickness t on a substrate with thickness d at a constant temperature, the radius of curvature can be expressed as:

$$\frac{1}{R} = \frac{6(1-u)t}{d^2}\left(\frac{1}{3}\frac{d\varepsilon_g}{dP}\Delta n\right)$$

where u is the Poisson's ratio.

Hence by measuring the radius of curvature of such a film exposed to infrared photons (e.g., by an optical or a capacitive technique), film strain can be measured, which in turn will allow the determination of $\Delta n$ and thus detect the infrared photons.

The reciprocal of the radius of curvature is approximately equal to $d^2z/dy^2$. The maximum displacement $z_{max}$ will depend on several physical and mechanical properties of the quantum well semiconductor.

The number density of excess charge carriers $\Delta n$ generated by an incident radiant power $\Phi_e^{abs}$ in a semiconductor microcantilever is expressed as follows:

$$\Delta n = \eta \frac{\lambda}{hc} \frac{\tau_L}{lwt} \Phi_e^{abs}$$

where η is the quantum efficiency, h is Planck's constant, c is the speed of light ($3 \times 10^8$ M/sec), and $\tau_L$ is the lifetime of the carriers in the quantum well structure.

Then the maximum displacement $z_{max}$ can be rewritten as:

$$z_{max} \approx \eta \frac{(1-v)l^2}{t} \frac{\lambda}{hc} \frac{d\varepsilon}{dP} \frac{1}{lwt} \tau_L \Phi_e^{abs}$$

The deflection responsivity $\Re = z_{max}/\Phi_e^{abs}$, viz.

$$\Re \approx \eta \frac{(1-v)l}{t^2} \frac{\lambda}{hc} \frac{d\varepsilon}{dP} \frac{1}{w} \tau_L$$

As can be seen, the photon detector 10 utilizes quantum well effects, that is, the change in band gap energy with pressure and the induced lattice strain due to changes in charge carrier concentration. Such a quantum photon detector utilizes the interaction of photons with matter and is based on the ejection of electrons from a bound state to an extended band leading to the photo-induced bending of the microstructure. Because the photon detector 10 is based on the principle of detecting mechanical strain, rather than by sensing a photocurrent in an applied electric field, the photon detector 10 avoids the "dark current" problems associated with prior art detectors. The photon detector 10 can thus operate over a wide range of temperatures without the need for complex and costly cooling apparatus.

Figure 3:
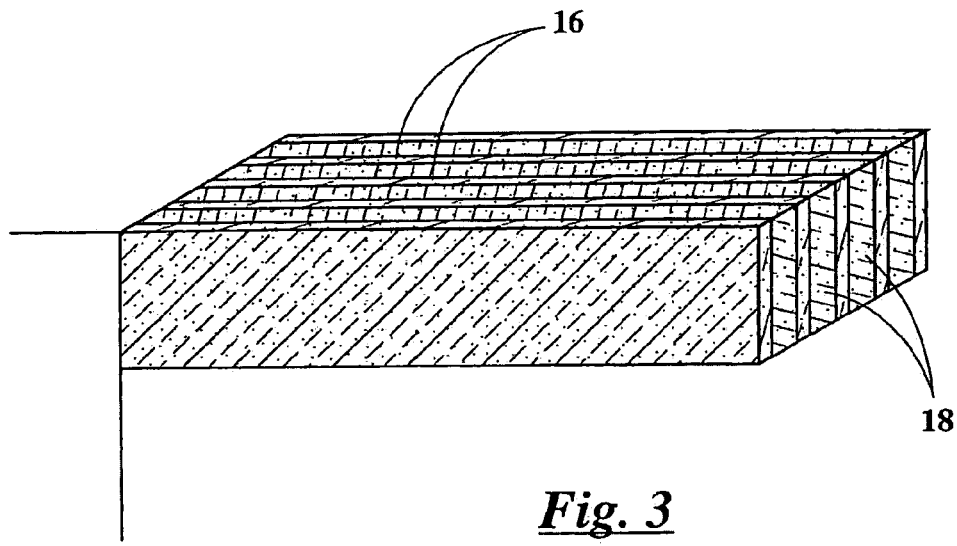
FIG. 3 is a schematic representation of a photon sensor according to a second embodiment of the present invention.
Figure 4:
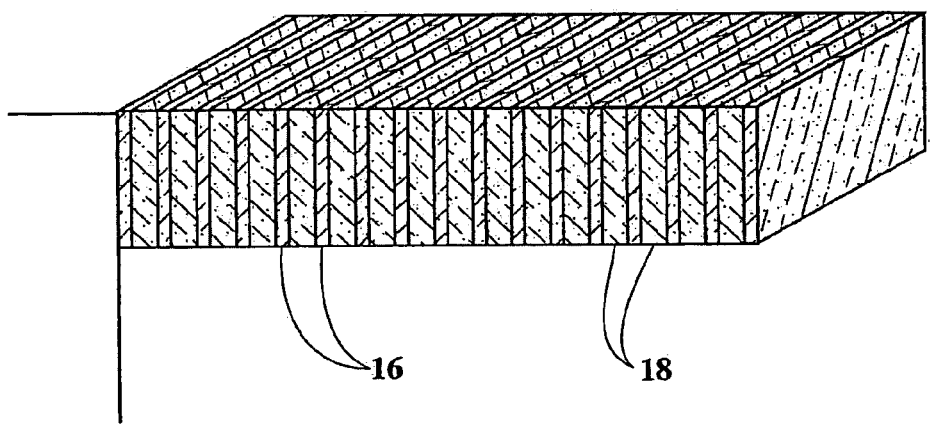
FIG. 4 is a schematic representation of a photon sensor according to a third embodiment of the present invention.

The orientation of the layers of semiconductor material can also be arranged according to the particular application The maximum absorption would occur when the propagation of photons is perpendicular to the well orientation. Thus vertical layers of narrow bandgap material 16 and wider bandgap material 18, as shown in FIGS. 3 and 4, would be preferable in certain applications to maximize absorption. However, vertical layers 16, 18 are harder to fabricate given the current state of manufacturing technology. Also vertical layers would result in a stiffer structure such that responsiveness will be decreased. Conversely, horizontal layers 12, 13, as shown in FIGS. 1 and 2, are easier to manufacture, but absorption is lower. Those skilled in the art will appreciate that it is possible to position a grating on top of the structure to increase absorption and thereby make horizontal layers more suitable for applications requiring a sensitive detector.

Methods and apparatus for measuring deflection of a microcantilever are well known. Any of a variety of conventional apparatus and methods for detecting deflection of the sensing element can be used, including tunneling, interferometric, and straight deflection detection apparatus and methods. Such methods and apparatus are described, for example, in "Scanning Force Microscopy: With Applications to Electric, Magnetic and Atomic Forces" by Dror Sarid (Oxford Univ Press; ISBN: 019509204X). Such methods and apparatus are thus well within the level of ordinary skill in the art and are thus described herein only briefly.

Figure 5:
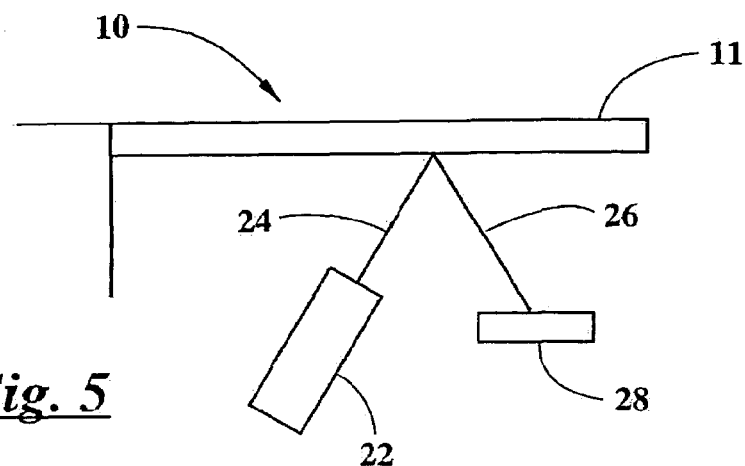
FIG. 5 is a schematic representation of a first method and apparatus for detecting the extent of deflection of any of the photon sensors of FIGS. 1-4.

FIG. 5 schematically illustrates a method and apparatus for detecting deflection of the microcantilever 11 when exposed to photons, using a straight deflection detection apparatus. A diode laser 22 directs an incident beam of light 24 onto the microcantilever 11. The reflected beam 26 strikes a position-sensitive photodetector 28. The output current of the photodetector 28 is proportional to the magnitude of deflection of the microcantilever 11.

Figure 6:
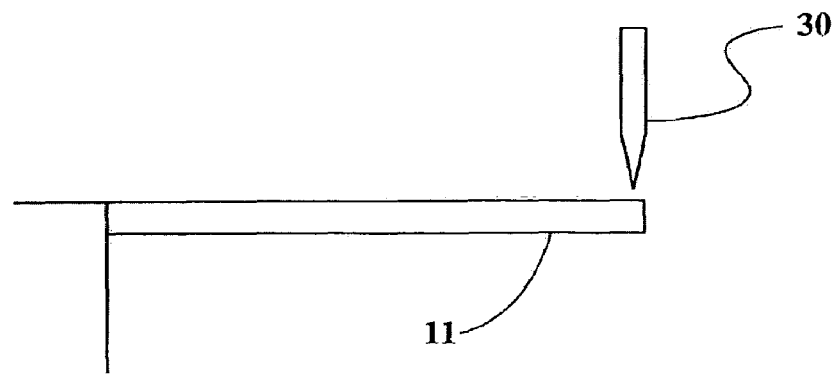
FIG. 6 is a schematic representation of a second method and apparatus for detecting the extent of deflection of any of the photon sensors of FIGS. 1-4.

Referring now to FIG. 6, measuring deflection of a microcantilever by tunneling involves an auxiliary conducting tip 30 separated from the microcantilever 11 by several angstroms. A bias voltage is applied between the conducting tip 30 and the microcantilever 11, producing a tunneling current through the air gap separating the two. Minute deflection of the microcantilever 11 will vary the gap between the microcantilever and the conducting tip 30 and produce a change in the tunneling current.

Figure 7:
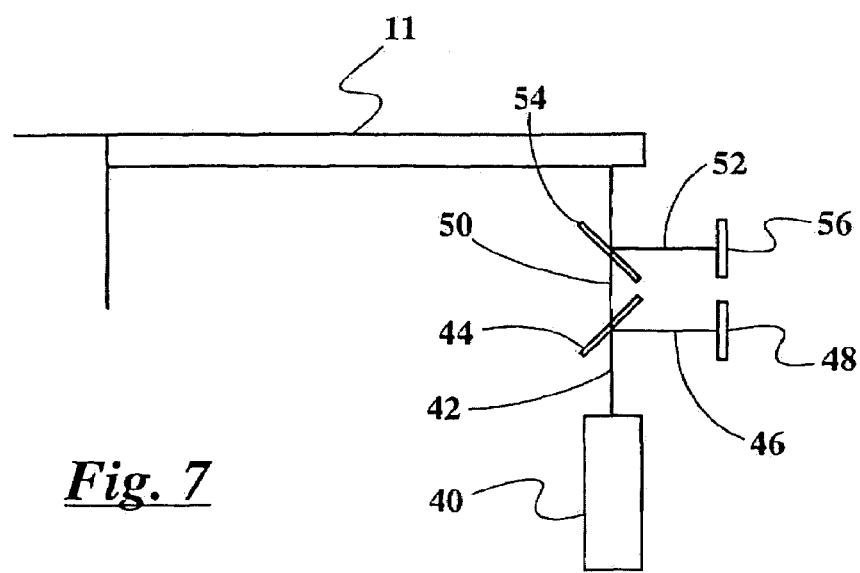
FIG. 7 is a schematic representation of a third method and apparatus for detecting the extent of deflection of any of the photon sensors of FIGS. 1-4.

Measuring deflection of the microcantilever 11 by interferometry is illustrated schematically in FIG. 7. While the interferometric arrangement can comprise either a homodyne or a heterodyne detection system, FIG. 7 and the description which now follows pertain to a homodyne system.

A light source 40 transmits a polarized laser beam 42 through a first beam splitter 44, which deflects a portion 46 of the beam, which serves as a reference signal, onto a first photodetector 48. The remainder 50 of the beam, which serves as a signal beam, is incident on the microcantilever 11. The beam 52 reflected back from the microcantilever 11 is deflected by a second beam splitter 54 onto a second photodetector 56. The output currents of the two photodetectors 48, 56 are compared, and the difference yields a signal which measures the deflection of the microcantilever.

Figure 8:
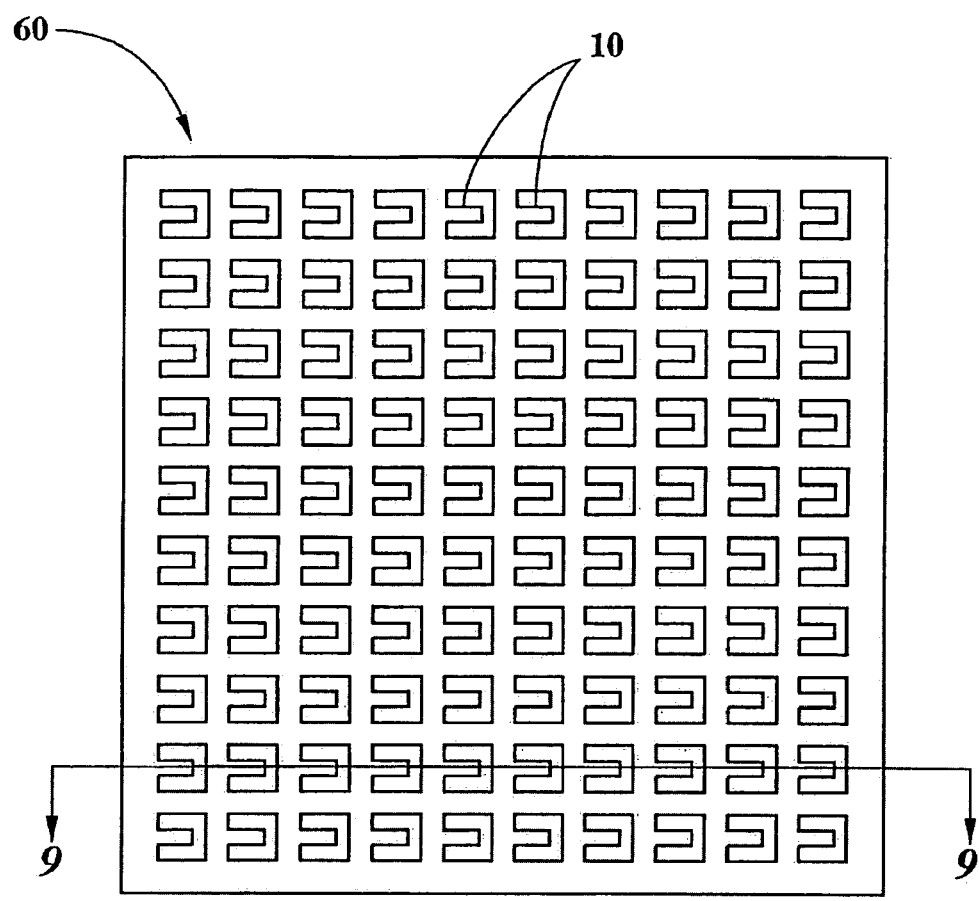
FIG. 8 is a top view of a two-dimensional array of sensors for providing imaging capability.
Figure 9:
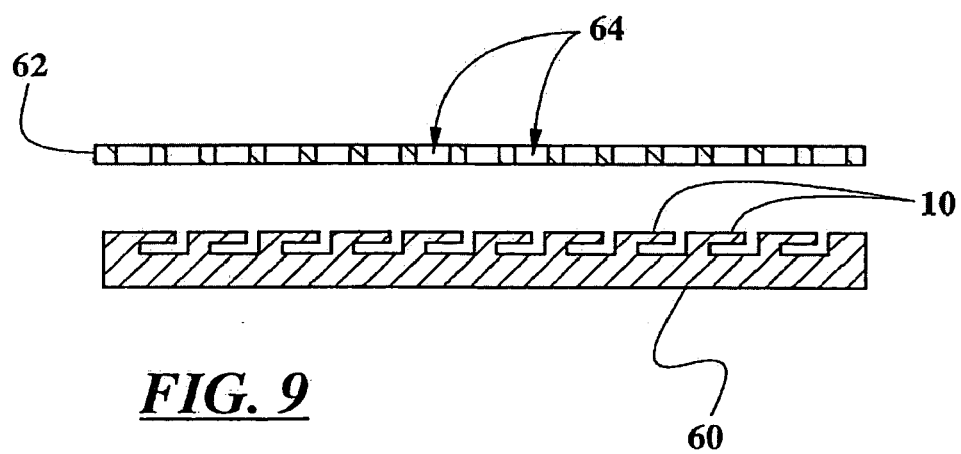
FIG. 9 is a cross-sectional side view of the array of sensors taken along line 9-9 of FIG. 8.

Referring now to FIGS. 8 and 9, a plurality of sensors 10 can be arranged in a two-dimensional matrix or imaging array 60 to provide imaging capability. To enhance the efficiency of the imaging array 60, a grid 62 having a plurality of slots or apertures 64 can optionally be provided through which the incoming photon beam passes. By controlling the width of the slots in the grid, the device 60 can be "tuned" to maximize sensitivity to specific wavelengths.

While the foregoing embodiment has been disclosed with respect to a device wherein the sensing element is shaped as a microcantilever, it will be understood that the sensing elements can be made out of semiconductors in different shapes that will deform in response to photo-induced stress. Such alternate shapes include, but are not limited to, microbridges, microplates, and diaphragms comprised of alternating layers of semiconductor materials forming quantum wells.

Finally, it will be understood that the preferred embodiment has been disclosed by way of example, and that other modifications may occur to those skilled in the art without departing from the scope and spirit of the appended claims.

What is claimed is:

1. A sensor for detecting electromagnetic radiation comprising:
    a deflectable member, said member being comprised of thin layers of a narrower-gap semiconductor material disposed between thicker barrier layers of a wider-gap material, whereby said thin layers of a narrower-gap semiconductor material disposed between said thicker barrier layers of a wider-gap material create quantum wells structures; and
    means for detecting the extent of deflection of said deflectable member,
    whereby when electromagnetic radiation strikes said sensor, mechanical strain is created within said quantum wells structures, and
    whereby mechanical strains created within said layers cause said deflectable member to deflect, which deflection is detected by said detecting means to indicate electromagnetic radiation striking said sensor, wherein said deflectable member comprises a microplate.

2. A sensor for detecting electromagnetic radiation comprising:

a deflectable member, said member being comprised of thin layers of a narrower-gap semiconductor material disposed between thicker barrier layers of a wider-gap material, whereby said thin layers of a narrower-gap semiconductor material disposed between said thicker barrier layers of a wider-gap material create quantum wells structures; and means for detecting the extent of deflection of said deflectable member, whereby when electromagnetic radiation strikes said sensor, mechanical strain is created within said quantum wells structures, and whereby mechanical strains created within said layers cause said deflectable member to deflect, which deflection is detected by said detecting means to indicate electromagnetic radiation striking said sensor, wherein said deflectable member comprises a diaphragm.

3. A sensor for detecting electromagnetic radiation comprising:

a deflectable member, said member being comprised of thin layers of a narrower-gap semiconductor material disposed between thicker barrier layers of a wider-gap material whereby said thin layers of a narrower-gap semiconductor material disposed between said thicker barrier layers of a wider-gap material create quantum wells structures; and means for detecting the extent of deflection of said deflectable member, whereby when electromagnetic radiation strikes said sensor, mechanical strain is created within said quantum wells structures, and whereby mechanical strains created within said layers cause said deflectable member to deflect, which deflection is detected by said detecting means to indicate electromagnetic radiation striking said sensor, further comprising a grid disposed between said deflectable member and a source of electromagnetic radiation, said grid defining apertures therein, said apertures having a width corresponding to a wavelength desired to be detected.

* * * * *